(12) United States Patent
Izumi

(10) Patent No.: US 6,593,577 B2
(45) Date of Patent: Jul. 15, 2003

(54) ELECTROMAGNETIC WAVE DETECTING DEVICE

(75) Inventor: Yoshihiro Izumi, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/034,188

(22) Filed: Jan. 3, 2002

(65) Prior Publication Data

US 2002/0134943 A1 Sep. 26, 2002

(30) Foreign Application Priority Data

Feb. 7, 2001 (JP) ........................................ 2001-031567

(51) Int. Cl.[7] ................................................. G01T 1/24
(52) U.S. Cl. .............................. 250/370.09; 250/370.08
(58) Field of Search ........................ 250/370.09, 370.08, 250/214.1, 208.2

(56) References Cited

U.S. PATENT DOCUMENTS

| 5,912,465 A | * | 6/1999 | Kobayashi et al. | ..... 250/370.09 |
| 6,262,408 B1 | * | 7/2001 | Izumi et al. | ............. 250/208.1 |
| 6,407,374 B1 | * | 6/2002 | Sato et al. | ................ 250/208.1 |
| 6,512,279 B2 | * | 1/2003 | Kaifu et al. | ........... 250/370.09 |

FOREIGN PATENT DOCUMENTS

JP 2001-015726 1/2001

OTHER PUBLICATIONS

"A New Digital Detector for Projection Radiography", Lee et al., Proceedings of SPIE, vol. 2432, Medical Imaging 1995.

U.S. patent application Ser. No. 09/657,528 filed Sep. 8, 2000 (copy attached).

* cited by examiner

Primary Examiner—Diego Gutierrez
Assistant Examiner—Yaritza Guadalupe
(74) Attorney, Agent, or Firm—Nixon & Vanderhye, P.C.

(57) ABSTRACT

An electromagnetic wave detecting device is provided with an active matrix substrate having signal input terminals and signal output terminals in its circumference, a semiconductor film, provided on the active matrix substrate, having electromagnetic wave conductivity, and a bias electrode having a connecting section, to which a bias supply power source is connected, for applying a bias voltage to the semiconductor film, and at least one of the signal input terminals and the signal output terminals are provided offset so as to be on a side which is away from the connecting section of the bias electrode, which makes it possible to prevent an unnecessary electric discharge between the connecting section of the bias electrode and at least one of the signal input terminals and the signal output terminals.

12 Claims, 10 Drawing Sheets

ELECTROMAGNETIC WAVE DETECTING DEVICE

FIELD OF THE INVENTION

The present invention relates to an electromagnetic wave detecting device which is capable of detecting electromagnetic waves including radiation such as x-rays, visible light and infrared light.

BACKGROUND OF THE INVENTION

Conventionally, known is a two-dimensional electromagnetic wave detecting device in which (a) a semiconductor film which generates an electric charge (an electron-hole pair) by sensing an electromagnetic wave such as X-ray, that is, an electromagnetic wave conductive semiconductor film, and (b) a semiconductor sensor which is made up of pixel electrodes and other elements are disposed in a two-dimensional manner, and in which a switching element is provided on each of the pixel electrodes. In the electromagnetic wave detecting device, the charge is read out column by column by turning on the switching element row by row.

For example, concrete structures and principles of two-dimensional image detecting device which corresponds to the above electromagnetic wave detecting device are disclosed in "A NEW DIGITAL DETECTOR FOR PROJECTION RADIOGRAFY" (D. L. Lee, et al., SPIE, 2432, pp.237–249, 1995). Referring to FIG. 9, the principle of the two-dimentional image detector is described below.

The two-dimensional image detecting device has bias electrodes 102 and a plurality of charge collector electrodes 103 which are respectively on upper and lower layers of a semiconductor film 101 made of Se showing electromagnetic wave conductivity. Each of the charge collector electrodes 103 are respectively connected to charge storage capacitor (having a capacitance of Cs) 104 and an active element (TFT) 105. Note that, dielectric layers 106 and 107 as electron blocking layers are provided as needed between the semiconductor film 101 and the bias electrode 102, and between the semiconductor film 101 and charge collector electrode 103, respectively. In addition, 108 indicates an insulating substrate, and the bias electrode 102 is connected to a high voltage power source 109.

When an electromagnetic wave, such as an x-ray, is directed to such a two-dimensional image detecting device, a charge (an electron-hole pair) is generated in the semiconductor film 101. At this stage, the semiconductor film 101 and the charge storage capacitor 104 are serially connected electrically. Therefore, by previously applying a bias voltage to the bias electrode 102, an electron of the charge (electron-hole pair) generated in the semiconductor film 101 moves to a positive (+) electrode side, and a hole moves to a negative (−) electrode side, thereby storing the charge in the charge storage capacitor 104.

By turning on the active element 105, the charge stored in the charge storage capacitor 104 can be taken outside. By (a) thus disposing the charge collector electrode 103, the charge storage capacitor 104 and the active element 105 in a two-dimensional manner, and (b) reading out charges in a line-sequential manner, it becomes possible to obtain two-dimensional information of an electromagnetic wave which is a detection target.

Generally, Se, CdTe, CdZnTe, $PbI_2$, $HgI_2$, SiGe, Si, etc. are used as the semiconductor film 101 which has electromagnetic wave conductivity. Among them, an Se film has a small dark current (a leak current) characteristic and is capable of large-area deposition at a low temperature by vacuum evaporation. For those reasons, the Se film is widely used for the electromagnetic wave detecting device (particularly x-ray detecting device) having a structure in which a semiconductor film 101 is formed directly on an active matrix substrate 110 (see FIG. 9).

As shown in FIG. 10(a) and FIG. 10(b), the two-dimensional electromagnetic wave detecting device using the above-described active matrix substrate 110 has a structure where a driving signal (scanning signal) for driving the active element 105 in a line-sequential manner is inputted from the circumference of the active matrix substrate 110, and each pixel, that is, charges stored in the charge storage capacitor 104 are outputted outside in response to the detection of x-ray (electromagnetic wave). Note that, reference numeral 116 indicates a projection region which is pixel electrode alignment region, shown by a thick line in FIG. 10(b).

The active matrix substrate 110 has scanning lines and readout lines in a lattice manner (usually, matrix of 500×500–3000×3000 pixels). These scanning line and readout line are connected respectively to a signal input terminal 111 and a signal output terminal 112 which are formed in the circumference of the active matrix substrate 110. On the active matrix substrate 110 shown in FIG. 10(a) and FIG. 10(b), the signal input terminals 111 connected to the scanning line are formed along first two sides facing each other (left and right sides), and the signal output terminals 112 connected to the readout line are formed along second two sides facing each other (upper and lower sides).

Further, a gate driver 113 (a driving LSI) is connected to the signal input terminal 111 by a mounting method such as TAB or COG and a readout amplifier 114 which is made up of LSI is connected to the signal output terminal 112 by the same method.

The signal input terminals 111 and the signal output terminals 112 are arranged so as to divide one side into plural divisions corresponding to a plurality of gate drivers 113 (for example, TAB) and readout amplifiers 114 (for example, TAB) connected thereto. For example, in case where TABs for the readout amplifier 114 having 128-channel input terminals are connected with respect to the active matrix substrate 110 having 1536×1536 matrix, twelve TABs per one side are allocated along each side of active matrix substrate 110. Accordingly, it is designed to arrange signal output terminals 112 of the active matrix substrate 110 so as to divide one side into twelve divisions. Further, arrangement of the signal input terminals 111 and the signal output terminals 112 is substantially symmetrical with respect to the center Vo in the vertical direction and the center Ho in the horizontal direction, respectively. Note that, for purpose of explanation, FIG. 10 (a) shows an example that the signal input terminals 111 and the signal output terminals 112 are arranged at four divisions and seven divisions, respectively. In addition, the vertical direction and the horizontal direction are established for purpose of explanation; for example, the directions can be established conversely.

On the other hand, a voltage is applied to the bias electrode 102 from an external power source, that is, a high voltage power source shown in FIG. 9 through a bias supply line 115. Thus, the bias supply line 115 is connected to a connecting section 102a of the bias electrode 102. For limitation of space, the connecting section 102a of the bias electrode 102 is provided in the vicinity of the signal input terminal 111 and the signal output terminal 112.

Incidentally, with respect to the electromagnetic wave detecting device, a high voltage applied to the bias electrode 102 makes it effective to improve the sensitivity for detection of x-ray. Thus, if a-Se film which is capable to form a film easily, for example, is used as a semiconductor film 101 which has electromagnetic wave conductivity, nearly 5000V-15000V of a high voltage can be applied to the bias electrode 102.

However, with respect to the active matrix substrate 110, as described above, in case where the connecting section 102a, to which the bias supply line 115 is connected, of the bias electrode 102 is arranged in the vicinity of the signal input terminal 111 and the signal output terminal 112, application of a high voltage to the bias electrode 102 causes generation of an electrical discharge such as atmospheric discharges and surface creepage between the connecting section 102a and the signal input terminal 111 and between the connecting section 102a and the signal output terminal 112. This might damage the electromagnetic wave detecting device.

SUMMARY OF THE INVENTION

An object of the prevent invention is to provide an electromagnetic detecting device with high reliability which can prevent the generation of electrical discharge between a connecting section of a bias electrode and a signal input terminal and between the connecting section and a signal output terminal even if a high bias voltage is applied to the connecting section.

In order to achieve the above object, an electromagnetic wave detecting device of the present invention comprises:

an active matrix substrate including in its circumference signal input terminals and signal output terminals, a semiconductor film, provided on the active matrix substrate, having electromagnetic wave conductivity, and a bias electrode, having a connecting section to which a bias supply power source is connected, for applying a bias voltage to the semiconductor film, wherein at least one of the signal input terminals and the signal output terminals are provided offset so as to be on a side which is away from the connecting section of the bias electrode.

According to this structure, since at least one of the signal input terminals and the signal output terminals are provided offset so as to be on the side which is away from the connecting section of the bias electrode, it is possible to prevent an unnecessary electric discharge such as atmospheric discharge and surface creepage between the connecting section of the bias electrode and at least one of the signal input terminals and the signal output terminals.

That is, the connecting section of the bias electrode to which the bias supply power source is connected is not flat but special in shape. For this reason, even if a molding for insulation is performed, a poor insulation is likely to occur due to cracks in a molded part. As a result, the electric discharge between the connecting section and one of the signal input terminals and the signal output terminals is likely to occur. Therefore, using this structure can prevent the electric discharge between the connecting section and one of the signal input terminals and the signal output terminals. As a result, it is possible to prevent the damage to the electromagnetic wave detecting device by the electric discharge and to increase reliability of the electromagnetic wave detecting device.

For a fuller understanding of the nature and advantages of the invention, reference should be made to the ensuing detailed description taken in conjunction with the accompanying drawings.

DESCRIPTION OF THE EMBODIMENTS

Referring to FIG. 1 through FIG. 7, one embodiment of the present invention is described below.

Figure 10:
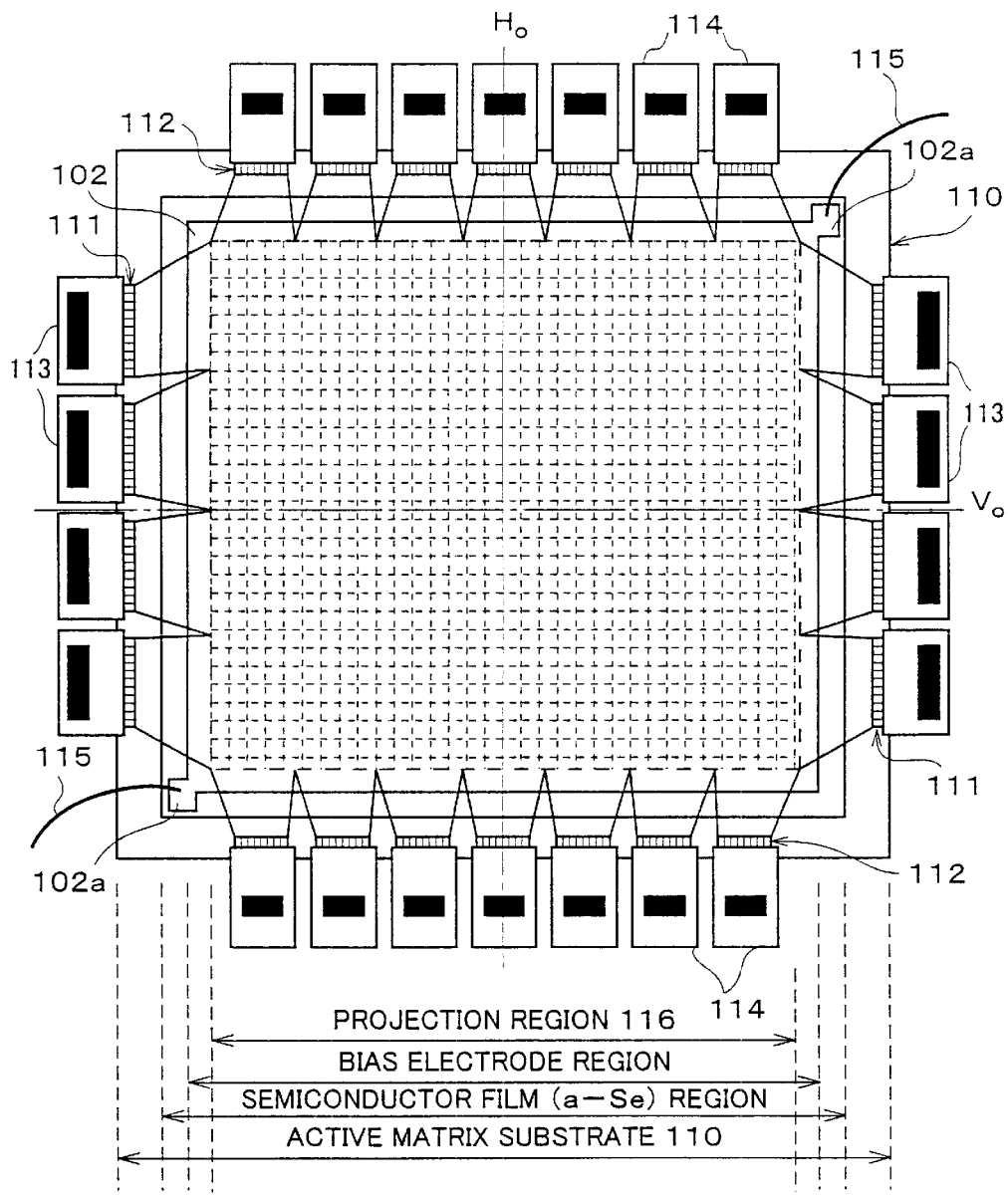
FIG. 10(a) is a plan view illustrating an arrangement of an electromagnetic wave detecting device according to the conventional electromagnetic wave detecting device.
FIG. 10(b) is a longitudinal sectional view schematically illustrating the electromagnetic wave detecting device.
Figure 10:
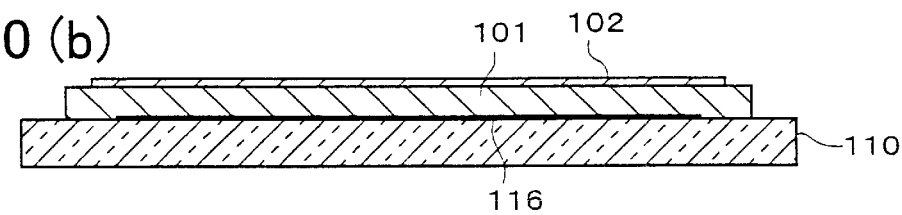

An electromagnetic wave detecting device according to the present embodiment is made up of the same members as a conventional electromagnetic wave detecting device shown in FIG. 10(a) and FIG. 10(b). That is, the electromagnetic wave detecting device according to the present embodiment is mainly provided with an active matrix substrate 11, a semiconductor film 12, a bias electrode 13, gate drivers 14 and readout amplifiers 15, as shown in FIG. 1(a) and FIG. 1(b).

The active matrix substrate 11 has active matrix array in a projection region 16 as a pixel electrode alignment region. Note that, the projection region 16 is shown by a thick line in FIG. 1(b), and the same is in FIG. 5(b), FIG. 6(b) and FIG. 7(b)

The semiconductor film 12 generates a charge by sensing an electromagnetic wave which is a detection target. The bias electrode 13 is provided for applying a bias voltage to the semiconductor film 12.

Figure 2:
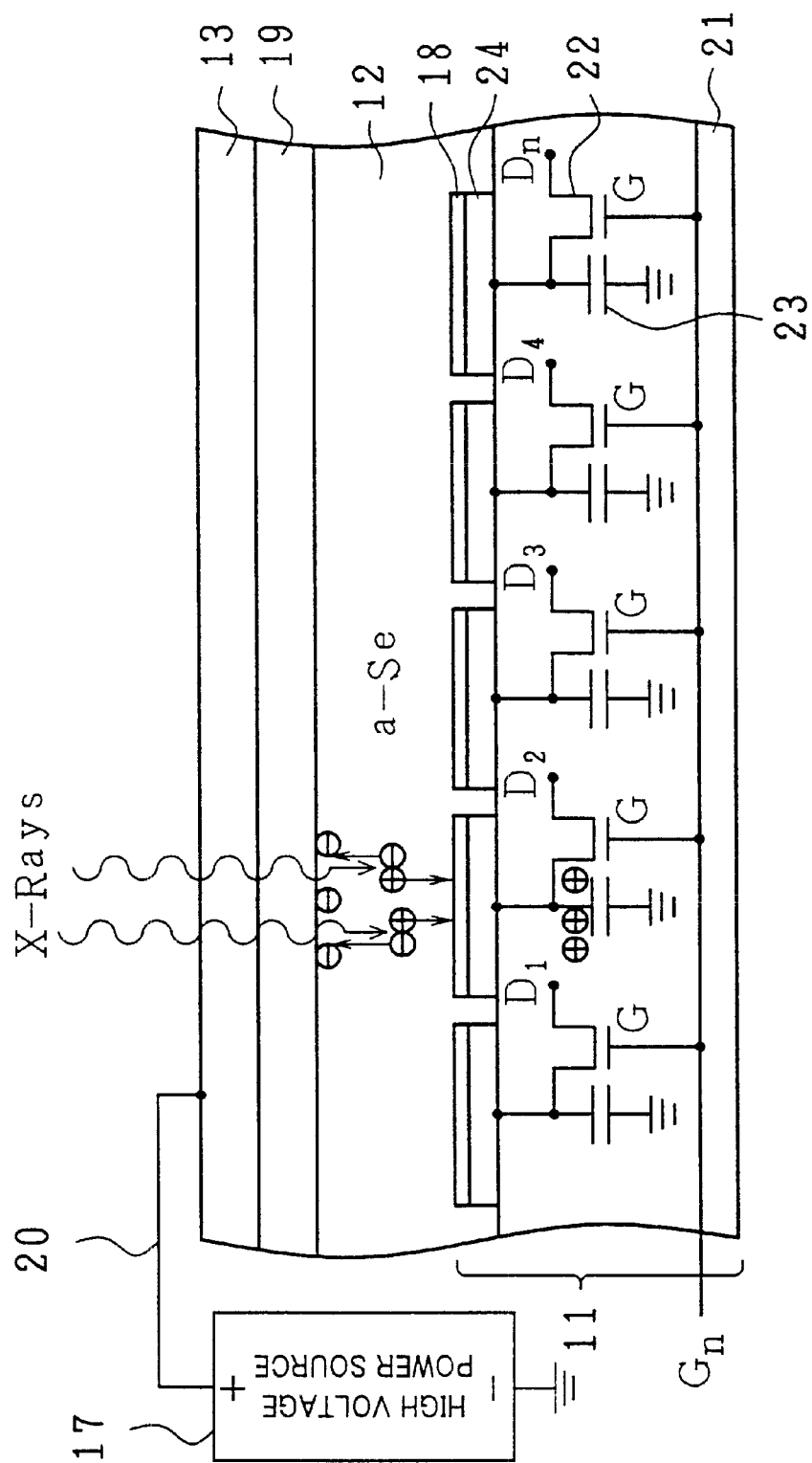
FIG. 2 is an explanatory view describing operating principles of the electromagnetic wave detecting device shown in FIG. 1(a).

As shown in FIG. 2, the active matrix substrate 11 has an arrangement in which an active matrix array is formed on an insulating substrate 21 which is made of glass, ceramics, or other material. The active matrix array has a structure in which active elements 22 each of which is made from, for example, a TFT element using either a-Si or p-Si, a charge storage capacitor (having a capacitance of Cs) 23, charge collector electrodes 24, and buslines such as scanning lines and readout lines are aligned in an XY matrix manner.

As described before, the semiconductor film 12 and the bias electrode 13 are formed on the active matrix substrate 11. A high voltage power source 17 is connected to the bias electrode 13. Further, dielectric layers 18 and 19 are provided as needed between the semiconductor film 12 and the bias electrode 13, and between the semiconductor film 12 and charge collector electrode 24.

The size of a pixel corresponding to the unit lattice of the XY matrix is substantially in a range between $0.1 \times 0.1$ mm$^2$ and $0.3 \times 0.3$ mm$^2$, and the common active matrix substrate has about $500 \times 500$–$3000 \times 3000$ pixels aligned in the XY matrix manner. Note that, the active element 22 is not limited to the foregoing TFT element, and MIM and a diode can be used instead.

Figure 3:
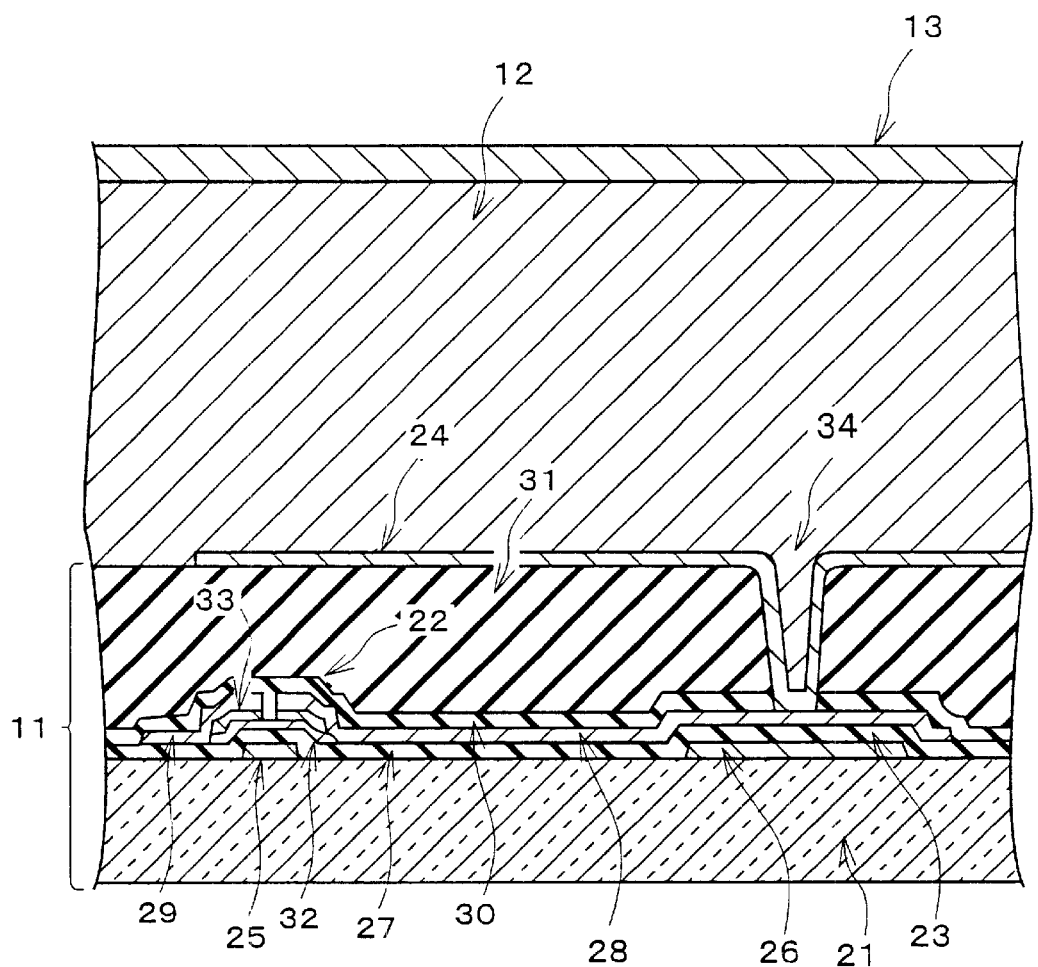
FIG. 3 is an enlarged longitudinal sectional view illustrating one piece of pixels in the electromagnetic wave detecting device shown in FIG. 1(a).

As shown more specifically in FIG. 3, the active matrix substrate 11 is made up of, for example, the insulating substrate 21 which is made from a glass substrate, on which a gate electrode 25, a charge storage capacitance (Cs) electrode 26, the charge storage capacitor 23, a gate insulating film 27, a connecting electrode (drain electrode) 28, a data electrode (source electrode) 29, the active element 22 which is made from TFT, an insulating protection film 30, an inter-layer insulating film 31, and the charge collector electrode 24, etc. are formed. Note that, the active element 22 has a channel layer 32 and a contact layer 33. Further, the charge collector electrode 24 is connected to connecting electrode 28 through a contact hole 34, which is formed in the inter-layer insulating film 31.

The active matrix substrate 11 is manufactured as follows. For example, a non-alkaline glass substrate (available from Corning Inc. as #1737, for example) may be used for a glass substrate as insulating substrate 21. Then, the gate electrode 25 and the charge storage capacitance electrode 26 are provided on the glass substrate. These are fabricated by vapor-depositing Ta, Al, or other metal on the glass substrate by sputtering to form a film having a thickness of about 3000 Å and then patterning the metal film into a desired shape.

The gate insulating film 27, made from SiNx, SiOx, or other materials, is fabricated so as to have a thickness of about 3500 Å by the CVD method on a substantial entirety of the glass substrate, thereby covering the gate electrodes 25 and the charge storage capacitance electrodes 26. The gate insulating film 27 has also a function as a dielectric for the charge storage capacitors 23. The gate insulating film is not necessarily fabricated only from SiNx, SiOx, etc.; alternatively, for simultaneous use with this kind of gate insulating film, an anodized film may be formed by anodizing the gate electrodes 25 and the charge storage capacitance electrodes 26.

Provided through the gate insulating film 27 over the gate electrode 25 are the channel layer (i layer) 32 provided as a channel section of the active element (TFT) 22, and the contact layer (n$^+$layer) 33 provided to act as a contact between the data electrode 29 and the connecting electrode (drain electrode) 28. These layers are fabricated by depositing a-Si by the CVD method to form films having thicknesses of about 1000 Å and 400 Å respectively and then patterning the a-Si films into desired shapes.

On the contact layer (n$^+$layer) 33, the data electrode 29 and the connecting electrode (drain electrode) 28 are fabricated. The connecting electrode 28 is also an electrode of upper layer of the charge storage capacitors 23. Specifically, the data electrode 29 and the connecting electrode 28 are fabricated, similarly to the foregoing gate insulating film 27 and the charge storage capacitance electrodes 26, by vapor-depositing Ta, Al, or other metal by sputtering to form a film having a thickness of about 3000 Å and then patterning the metal film into desired shapes.

The insulating protection film 30 is disposed to cover a substantial entirety of the insulating substrate (glass substrate) 21 on which the active elements (TFT) 22 and the charge storage capacitors 23 are fabricated. The insulating protection film 30 is fabricated by depositing SiNx by the CVD method to form a film having a thickness of about 3000 Å and then removing specified portions of the SiNx film where the contact holes 34 will be provided above the connecting electrodes 28.

Then, the inter-layer insulating film 31 is disposed to cover a substantial entirety of the top of the insulating protection film 30. The inter-layer insulating film 31 is fabricated by a coating apparatus such as a spinner which causes photosensitive acrylic resin or other similar material to have a thickness of about 3 $\mu$m. Polyimido resin or the like can be used instead as organic material having photosensitivity.

After that, the inter-layer insulating film 31 undergoes exposure and development processes (photolithography) with a photomask having a predetermined shield pattern to form the contact hole 34.

Then, the charge collector electrode (pixel electrode) 24 as a top layer of the active matrix substrate is fabricated on the active matrix substrate 11 by depositing electrical conductive film such as ITO or Al to form a film having thickness of about 1000 Å to 2000 Å and then patterning the film in a desired shape. In this manner, the active matrix substrate 11 is completed.

Next, in order to form an electromagnetic detecting device, the semiconductor film 12 which has electromagnetic wave conductivity is deposited to a substantial entirety of the active matrix region (projection region 16) of the active matrix substrate 11. Se, CdTe, CdZnTe, PbI$_2$, HgI$_2$ SiGe, Si or other materials can be used as the semiconductor film 12. It should be noted that, in the case of an electromagnetic wave detecting device having the structure in which the semiconductor film 12 is formed directly on the active matrix substrate 11 having active matrix array, it is optimal to use an amorphous Se film (a-Se film) as the semiconductor film 12. This is because the a-Se film is capable of large-area deposition at a low temperature by the vacuum evaporation method. Further, assuming that the electromagnetic wave detecting device is used as an X-ray detecting device, it is preferable that an Se film is formed to have a thickness ranging between 0.5 mm and 1.5 mm so as to absorb X-rays efficiently.

Next, the bias electrode 13, a top layer, is formed by using electrical conductive film such as Al or Au. A bias voltage is applied from the external high voltage power source 17 (shown in FIG. 2) to the bias electrode 13 through the bias supply line 20 (shown in FIG. 1). Note that, it is preferable to mold the connecting section of the bias electrode 13 and the bias supply line 20 to which a high voltage is applied, with a insulating resin such as silicone, epoxy, or polyimido.

Referring to FIG. 1(a) and FIG. 1(b), the whole arrangement of the present electromagnetic wave detecting device is described as follows. FIG. 1(a) is a plan view illustrating a electromagnetic wave detecting device, and FIG. 1(b) is a longitudinal sectional view schematically illustrating the electromagnetic wave detecting device.

As shown in FIG. 1(a) and FIG. 1(b), the active matrix substrate 11 of the electromagnetic wave detecting device has the projection region 16 which is a pixel electrode alignment region. Further, the bias electrode 13 of the electromagnetic wave detecting device has connecting sections 13a in the two corners which are diagonal to each other among four corners in the rectangular projection region 16. The two connecting sections 13a are connected to the bias supply lines 20 respectively to supply a high voltage from the foregoing high voltage power source 17 to the bias electrode 13.

The active matrix substrate 11 has a scanning line and a readout line in a lattice manner (usually, matrix of 500×500–3000×3000 pixels). The scanning lines and readout lines are connected respectively to signal input terminals 41 and signal output terminals 42 which are formed in the circumference of the active matrix substrate 11.

On the active matrix substrate 11, which is rectangular, shown in FIG. 1(a) and FIG. 1(b), the signal input terminals 41 are formed along first two sides facing each other (left and right sides), and the signal output terminals 42 are formed along second two sides facing each other (upper and lower sides).

As used herein, "terminal" of the signal input terminal 41 and the signal output terminal 42 means a section where the scanning line and the readout line connects electrically to an external circuit such as TAB. However, the connecting point (a wire extending part 43 shown in FIG. 4, etc.) where the section connects to the scanning line and the readout line is not included in the "terminal". In other words, "terminal" means a section where an electrode is bare for connecting external circuit (TAB, etc.) in the circumference of the active matrix substrate 11.

Figure 4:
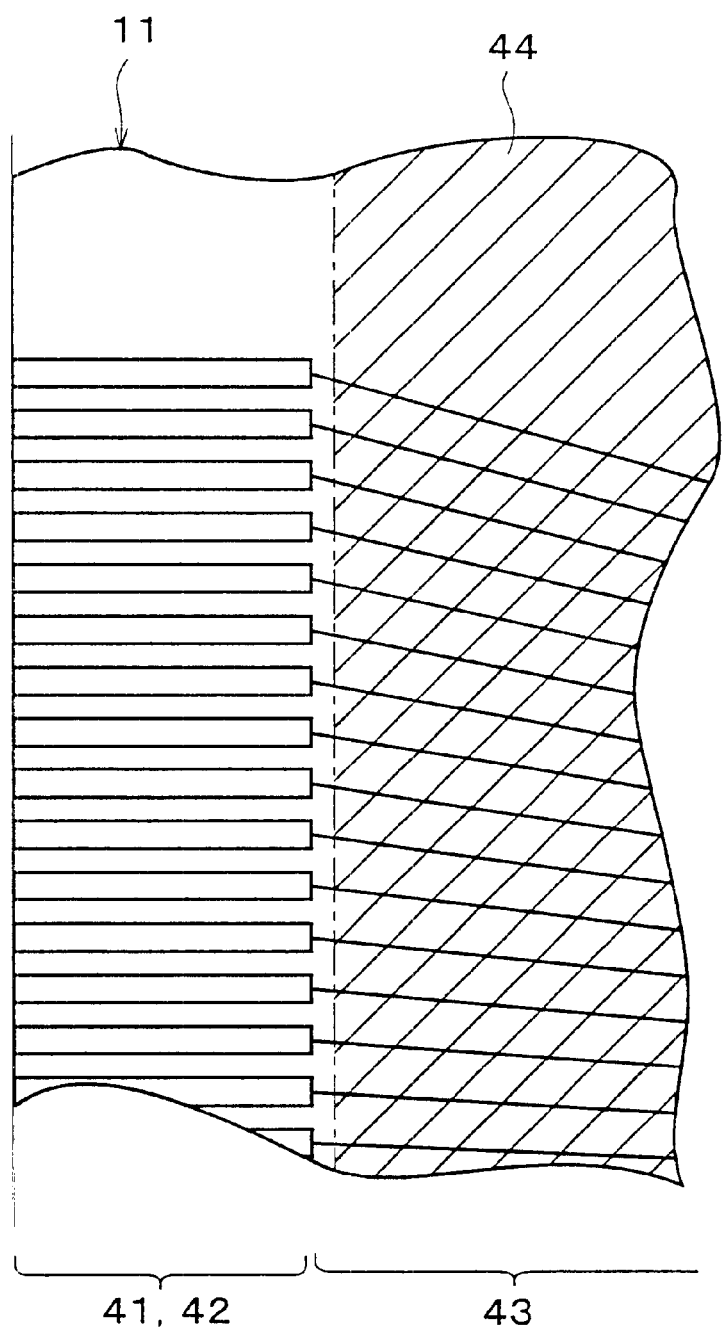
FIG. 4 is an explanatory view illustrating an arrangement in the vicinity of a signal input terminal and a signal output terminal in the electromagnetic wave detecting device shown in FIG. 1(a).

For reference, FIG. 4 shows an enlarged view illustrating the vicinity of the signal input terminal 41 and the signal output terminal 42 of the active matrix substrate 11 shown in FIG. 1(a). In FIG. 4, the signal input terminal 41 and the signal output terminal 42 are arranged at the edges of the active matrix substrate 11 and are not coated with a insulating film 44 shown by oblique lines. On the other hand, the wire extending part 43 which extends from the signal input terminal 41 and the signal output terminal 42 toward the inside of the active matrix substrate 11 is coated with the insulating film 44.

As shown in FIG. 1(a), a gate driver 14, a driving LSI, is connected to the signal input terminal 41 by a mounting method such as TAB, COG, or other method, and a readout amplifier 15 which is made up of LSI is connected to the signal output terminal 42 by the similar method. The signal input terminals 41 and the signal output terminals 42 are so arranged as to divide one side into plural divisions corresponding to a plurality of gate drivers 14 (for example, TAB) and readout amplifiers 15 (for example, TAB) connected thereto.

For example, in case where TABs for the readout amplifier 15 having 128-channel input terminals are connected to the active matrix substrate 11 having 1536×1536 matrix, twelve TABs per one side are allocated along each side of the active matrix substrate 11. Accordingly, it is designed to arrange the signal output terminals 42 of the active matrix substrate 11 so as to divide one side into twelve divisions. Note that, for purpose of explanation, FIG. 1(a) shows an example that the signal input terminals 41 and the signal output terminals 42 are arranged to be divided into four divisions and seven divisions, respectively.

Further, arrangement of the signal input terminal 41 and the signal output terminal 42 is provided offset about the center Vo in the vertical direction and offset about the center Ho in the horizontal direction so as to be on the side which is away from the connecting section 13a of the bias electrode 13. More specifically, when corners which are other than the corners where the connecting sections 13a of the bias electrode 13 are formed, that is, two corners diagonal to each other where the connecting sections 13a are not formed, are 13b, the signal input terminals 41 are arranged so as to be provided on the side of the corners 13b with respect to the center Vo in the vertical direction. Also, the signal output terminals 42 are arranged so as to be provided on the side of the corners 13b with respect to the center Ho in the horizontal direction.

Therefore, according to the electromagnetic wave detecting device of the present embodiment, compared to the conventional electromagnetic wave detecting device shown in FIG. 10(a), the distance A between the signal input terminal 41 and the connecting section 13a of the bias electrode 13 and the distance B between the signal output terminal 42 and the connecting section 13a of the bias electrode 13 are longer.

In the above structure, when an electromagnetic wave, such as an x-ray, is directed to such an electromagnetic wave detecting device, a charge (an electron-hole pair) is generated in the semiconductor film 12. At this stage, the semiconductor film 12 and the charge storage capacitor 23 are serially connected electrically. Therefore, by previously applying a bias voltage to the bias electrode 13, an electron of the charge (electron-hole pair) generated in the semiconductor film 12 moves to a positive (+) electrode side, and a hole moves to a negative (−) electrode side, thereby storing the charge in the charge storage capacitor 23.

By turning on the active element 22, charges stored in the charge storage capacitor 23 can be taken through the readout line and the signal output terminal 42 by the readout amplifier 15 connected to the signal output terminal 42. At this stage, since the charge collector electrode 24, the charge storage capacitor 23 and the active element 22 are arranged in a XY-matrix manner, it becomes possible to obtain two-dimensional information of an electromagnetic wave which is a detection target by driving the active element 22 and reading out charges in a line-sequential manner.

Assuming that an a-Se film is used here as a semiconductor film 12 having electromagnetic wave conductivity, it is preferable to apply about 10V/μm of the electric field intensity at maximum to the a-Se film so as to absorb the charge generating in the a-Se film by receiving electromagnetic wave (x-ray) efficiently. In such case, a high voltage of nearly 5000V–15000V can be applied to the bias electrode 13. Thus, a high voltage applied to the bias electrode 13 makes it effective to improve the sensitivity of detection of electromagnetic wave such as x-ray. Note that, it is preferable that an Se film is formed to have a thickness ranging between 0.5 mm and 1.5 mm so as to absorb electromagnetic waves, for example, X-rays efficiently.

In case of applying a high voltage to the bias electrode 13, it is necessary that the bias electrode 13, the bias supply line 20, and the connecting section 13a of the bias electrode 13 connected to the bias supply line 20 be well molded for insulation. That is, for example, a mold not having enough thickness or having defects such as a crack or a pinhole in the molded resin is likely to cause an electrical discharge such as atmospheric discharge and surface creepage between a high voltage applying part of the bias electrode 13 and a part of other electrode terminals in the circumference thereof. In case of such electrical discharge, a high voltage is also applied to elements of the active matrix substrate 11 and external LSIs such as the gate driver 14 and the readout amplifier 15 which are connected to the above other electrode, resulting in the damage to the electromagnetic wave detecting device.

Figure 8:
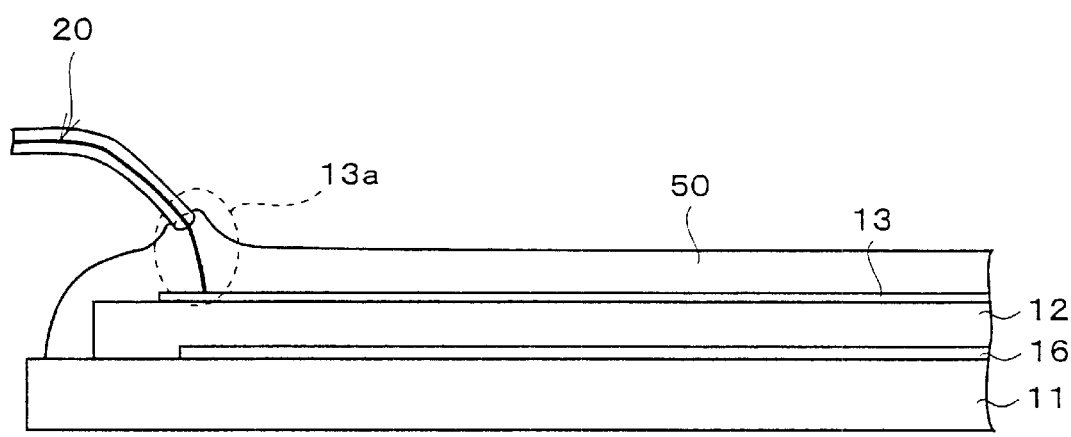
FIG. 8 is an explanatory view illustrating a connecting section between a signal input terminal and a bias supply line and between a signal output terminal and a bias supply line in the electromagnetic wave detecting device shown in FIG. 1(a).
Figure 9:
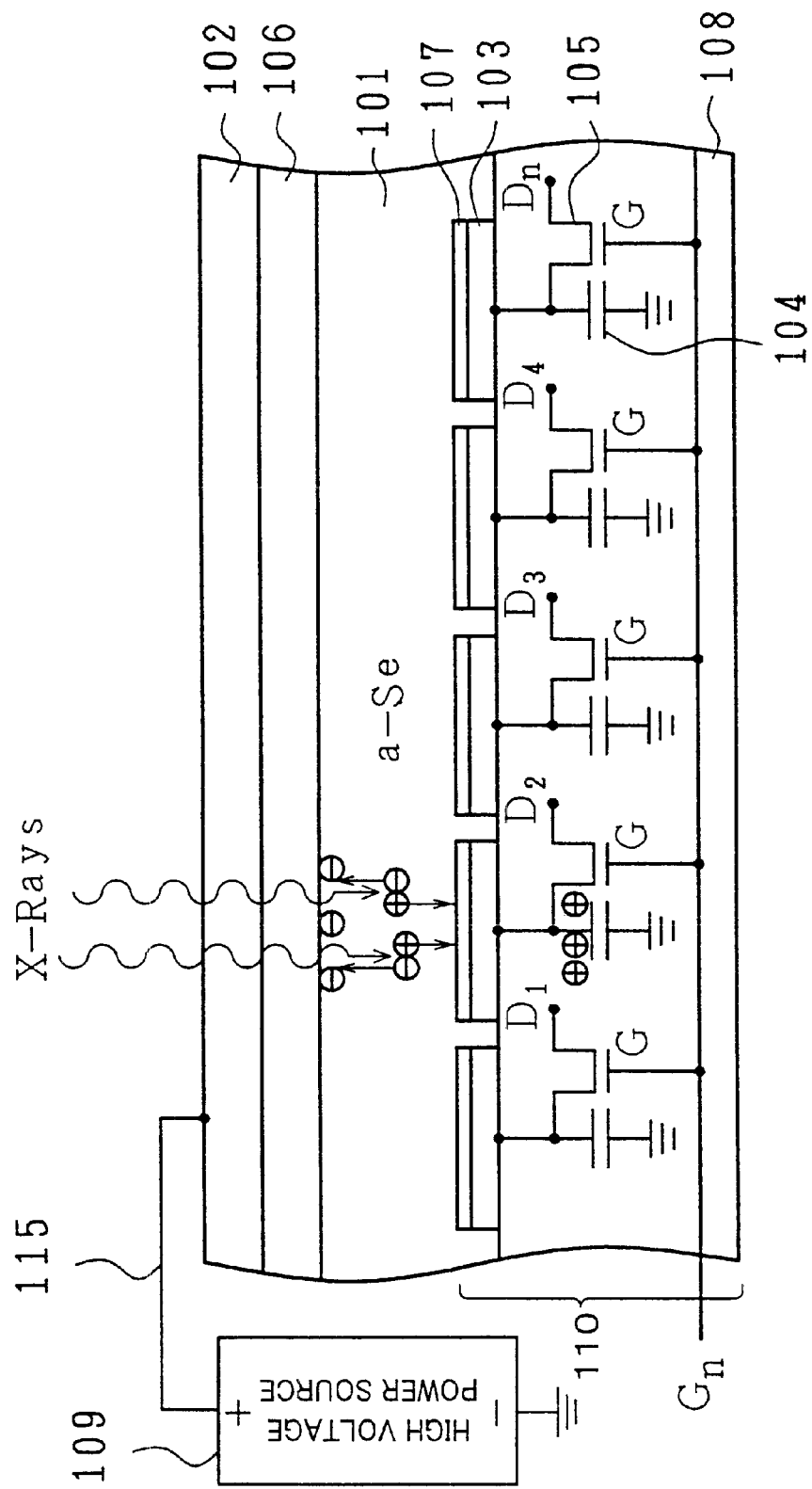
FIG. 9 is an explanatory view describing operating principles of a conventional electromagnetic wave detecting device.

On the other hand, the first part to be considered as the part where a electrical discharge is likely to occur is the part between (a) the signal input terminal 41 and the signal output terminal 42 and (b) the connecting section to the bias supply line 20, that is, the connecting section 13a. As shown in FIG. 8, although the connecting section 13a to be connected to the bias supply line 20 is molded for insulation by a molded resin 50, the mold for insulation here becomes a special shape, compared to other flat insulated molded region. For example, as shown in FIG. 8, the shape of the mold resin is complex, and the thickness of the resin layer covering the connecting section 13a is likely to be uneven. This is likely to cause defects such as a crack to the mold resin 50 of the connecting section 13a, which is likely to cause the above electrical discharge.

To solve such a problem, in the electromagnetic wave detecting device according to the present embodiment, the arrangement of the signal input terminal 41 and the signal output terminal 42 is provided offset about the center Vo in the vertical direction and offset about the center Ho in the horizontal direction so as to be on the side which is away from the connecting section 13a of the bias electrode 13, and in the active matrix substrate 11, the distance A between the signal input terminal 41 and the connecting section 13a of the bias electrode 13 and the distance B between the signal output terminal 42 and the connecting section 13a of the bias electrode 13 are long. Therefore, compared to a conventional electromagnetic wave detecting device, the present electromagnetic wave detecting device can inhibit occurrence of electrical discharge in the above-described part and the damage to the electromagnetic wave detecting device caused by the electrical discharge.

In researching the foregoing function for inhibiting the electrical discharge, the applicant of the present application carried out an experiment with the molded connecting section 13a for insulation using the electromagnetic wave detecting device which is applied for the above structure according to the present invention. The distance A between the signal input terminal 41 and the connecting section 13a of the bias electrode 13 and the distance B between the signal output terminal 42 and the connecting section 13a of the bias electrode 13 were 1 cm respectively in the conventional electromagnetic wave detecting device. However, the distances A and B were established to be 1.5 cm or more in the present invention. As a result, in the electromagnetic wave detecting device having longer distances A and B, if a voltage of 15000V was applied to the bias electrode 13, occurrence of the electrical discharge between the signal input terminal 41 and the connecting section 13a and between the signal output terminal 42 and the connecting section 13a could be remarkably decreased. The result of the experiment is shown in Table 1.

TABLE 1

| DISTANCE A AND DISTANCE B (cm) | 0.5 | 1.0 | 1.5 | 2.0 | 2.5 |
|---|---|---|---|---|---|
| PRESENCE OR ABSENCE OF ELECTRICAL DISCHARGE | X | X | O | O | O |

In Table 1, "O" means absence of electrical discharge, whereas "X"means presence of electrical discharge. The experiment was carried out in the condition where 15000V is applied to the bias electrode 13, and the connecting section 13a is molded for insulation.

Note that, although the present embodiment has been described through the structure that the bias electrode 13 for being connected to the bias supply line 20 are formed at two corners which are diagonal to each other of four corners of the bias electrode 13, and the signal input terminal 41 and the signal output terminal 42 are arranged so as to be on the side which is away from each connecting section 13a, it is to be understood that the described embodiment is not intended to limit the scope of the invention. That is, basically, the electromagnetic wave detecting device has only to have the structure that the signal input terminal 41 and the signal output terminal 42 are arranged so as to be on the side which is away from each connecting section 13a.

For example, the structure of the connecting section 13a can be formed only at one corner of the bias electrode 13 as well. In this case, the structure is made such that the signal input terminals 41 and the signal output terminals 42, which are provided on the sides adjacent to at least the connecting section 13a of the active matrix substrate 11, are provided offset so as to be on the side which is away from the connecting section 13a. In other words, the structure is made such that the signal input terminals 41 and the signal output terminals 42, which are provided on the sides adjacent to at least the connecting section 13a, are arranged offset so as to be on the side of the corner 13b which is an opposite corner of the connecting section 13a with respect to the center Vo in the vertical direction and the center Ho in the horizontal direction, respectively.

In addition, the structure in the above description is such that both the signal input terminals 41 and the signal output terminals 42 are arranged offset. However; the structure can instead be that at least one of the signal input terminal 41 and the signal output terminal 42 is provided offset. In this case, it is preferable that either the signal input terminals 41 or the signal output terminals 42 which are closer to the connecting section 13a are arranged offset.

Figure 5A:
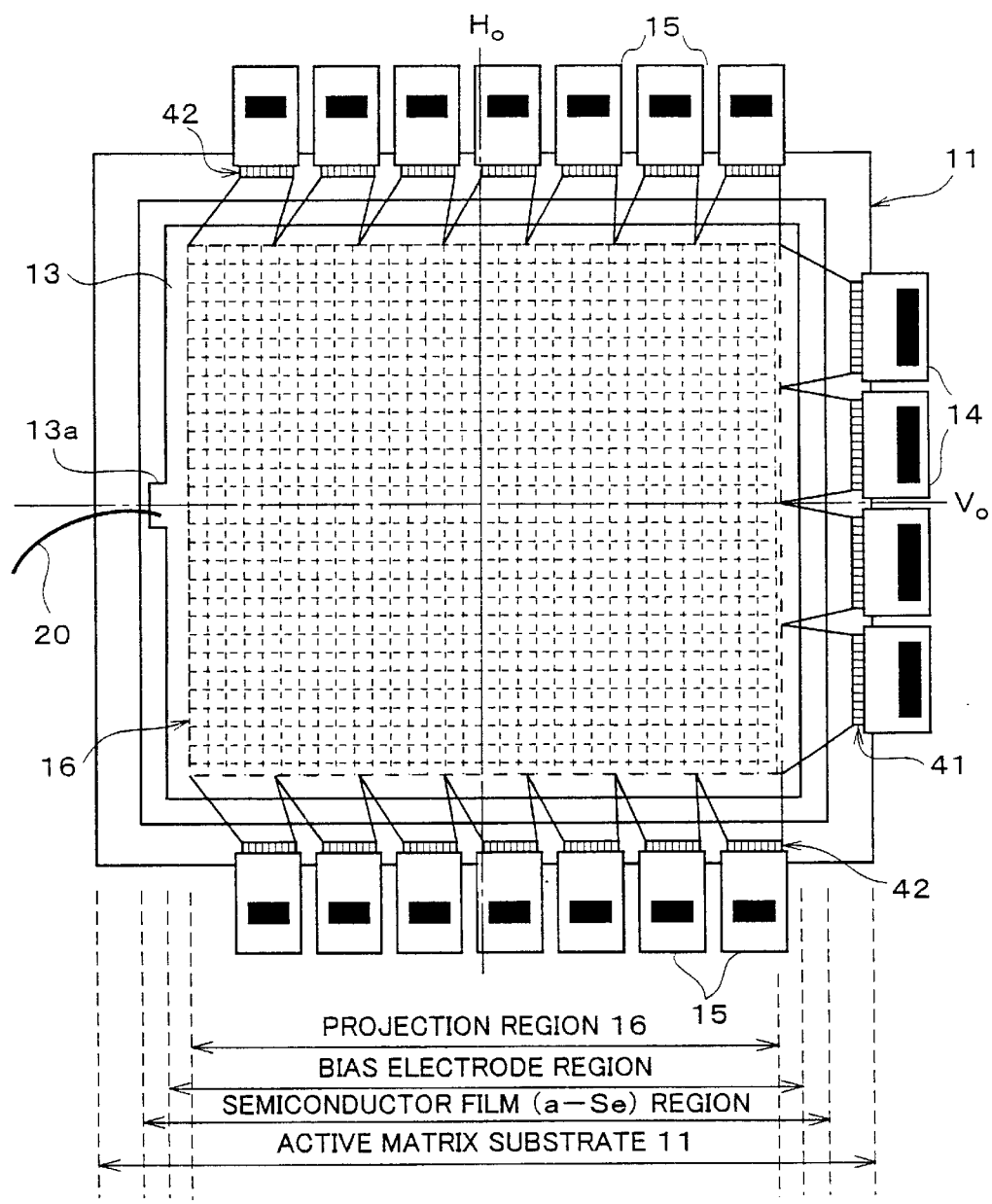
FIG. 5(a) is a plan view illustrating an arrangement of an electromagnetic wave detecting device according to another embodiment of the present invention.

Further, as shown in FIG. 5(a), in a case where the signal input terminals 41 which are connected to the scanning line are provided only one side of the active matrix substrate 11, the structure can be such that the connecting section 13a is formed not at the edge, but at a midway position, for example, at a center position on the side (the left side in FIG. 5) where the signal input terminals 41 do not exist. In this case, the structure is such that the signal output terminals 42 which are formed on two sides (upper and lower sides) adjacent to the side where the connecting section 13a is provided are provided offset so as to be away from the connecting section 13a on the side where the signal input terminal 41 is provided. Note that, the structure in which the signal input terminals 41 and the signal output terminals 142 are replaced with each other can be as well.

In addition, in a case where a-Se film is used as the semiconductor film 12 as described before, a high voltage of nearly 5000V-15000V can be applied as a bias voltage. In this case, if at least one of the distance A between the signal input terminal 41 and the connecting section 13a of the bias electrode 13 and the distance B between the signal output terminal 42 and the connecting section 13a of the bias electrode 13, are established to be 1.5 cm or more, the electric discharge between at least one of the signal input terminal 41 and the signal output terminal 42 and the connecting section 13a of the bias electrode 13 is ensured to be prevented even in case of applying a high voltage of 15000V to the connecting section 13a.

Figure 1:
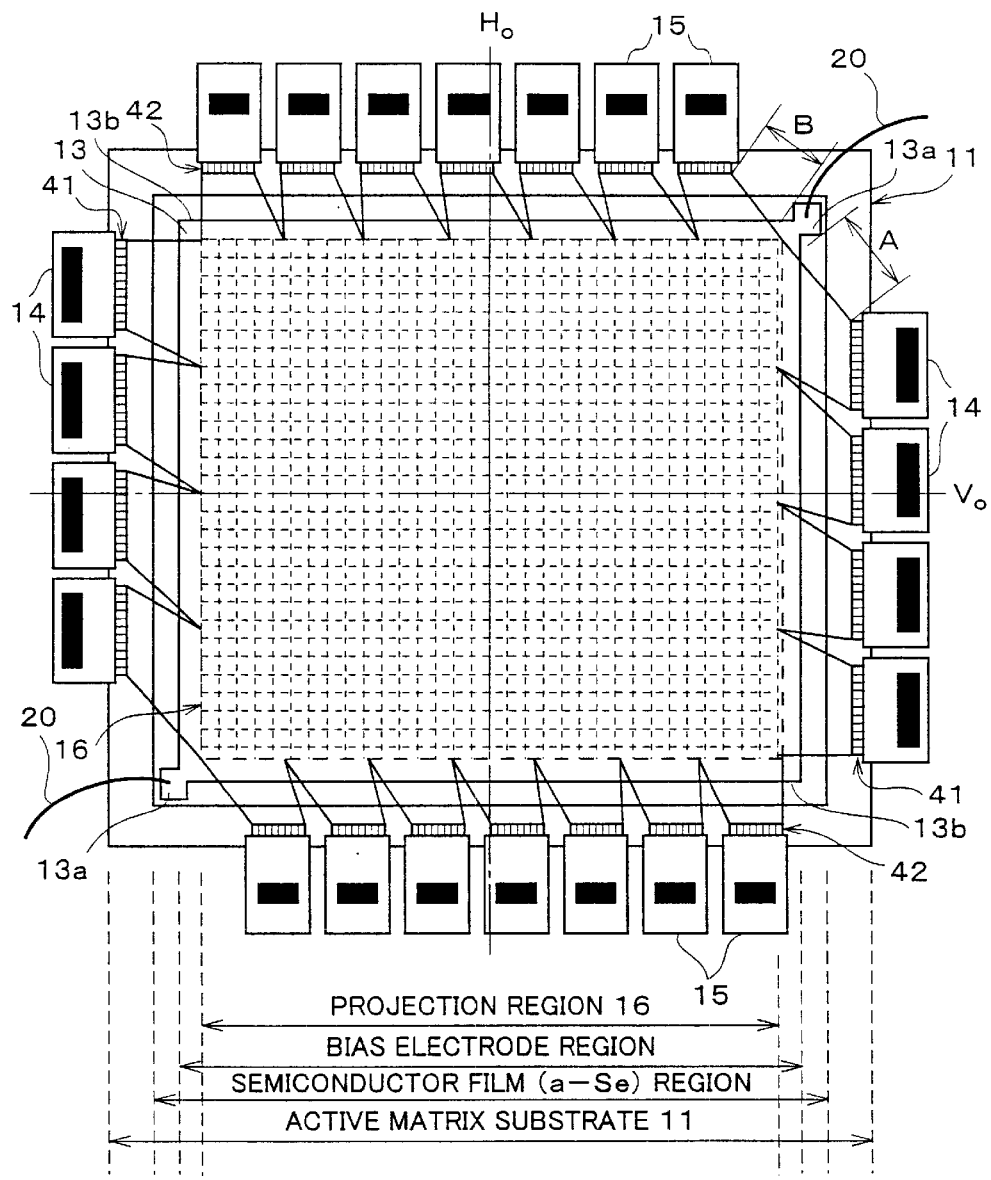
FIG. 1(a) is a plan view illustrating an arrangement of an electromagnetic wave detecting device according to one embodiment of the present invention.
FIG. 1(b) is a longitudinal sectional view schematically illustrating the electromagnetic wave detecting device.
Figure 1:
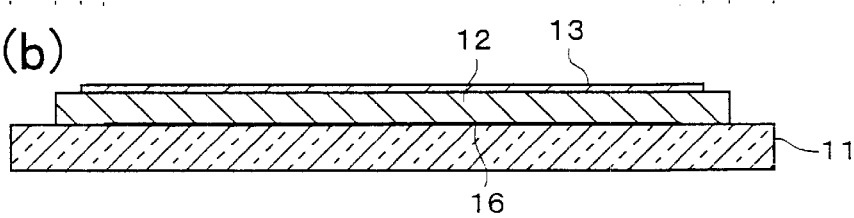
Figure 5:
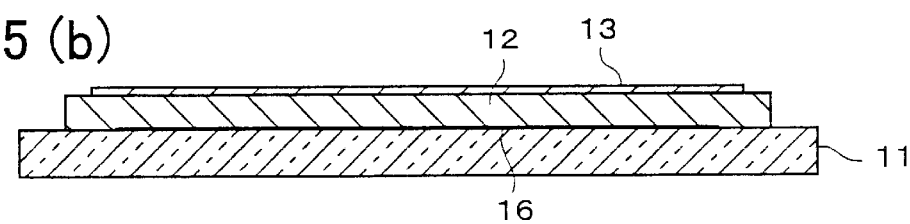
FIG. 5(b) is a longitudinal sectional view schematically illustrating the electromagnetic wave detecting device.
Figure 6A:
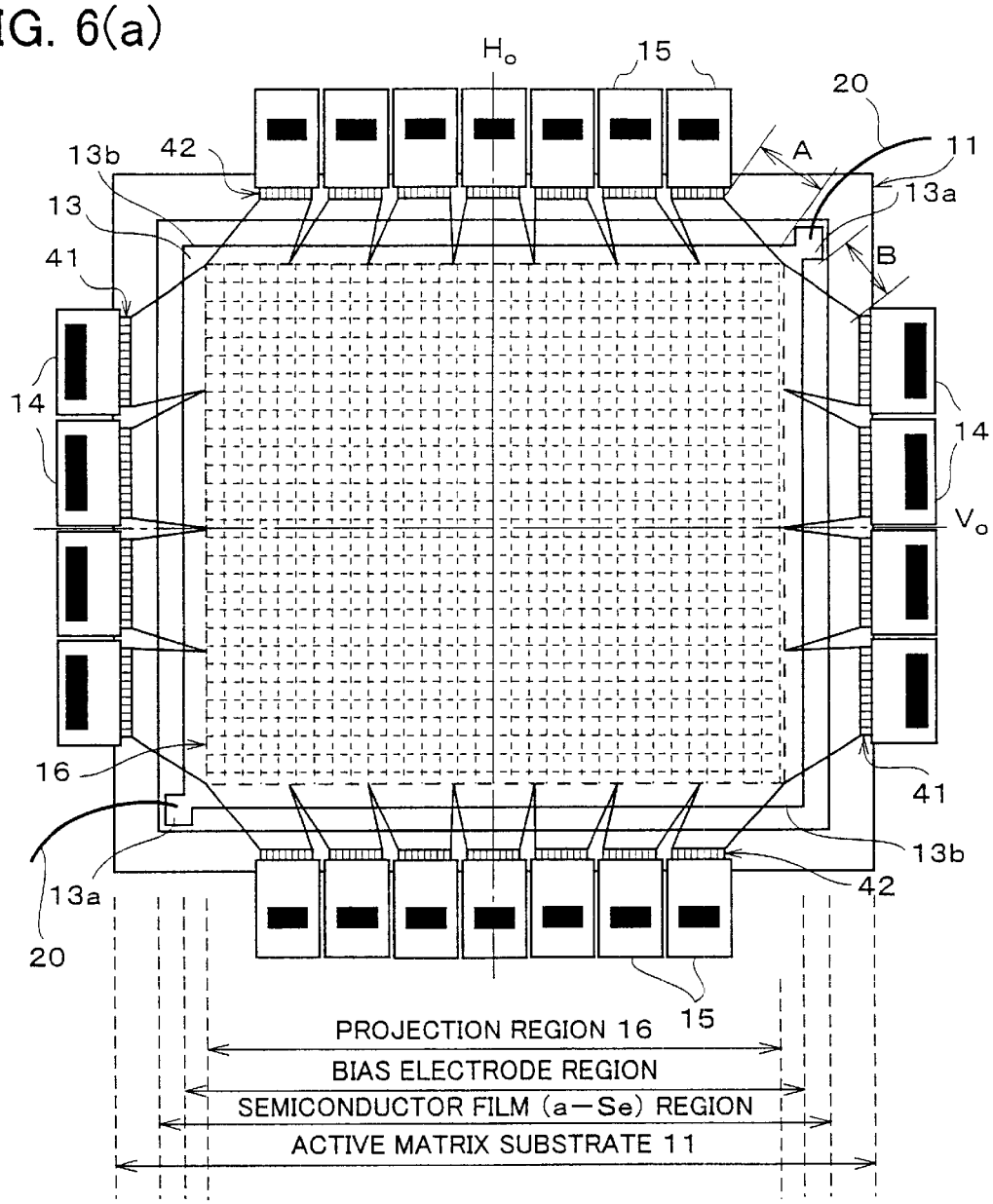
FIG. 6(a) is a plan view illustrating an arrangement of an electromagnetic wave detecting device according to a yet another embodiment of the present invention.
Figure 6B:
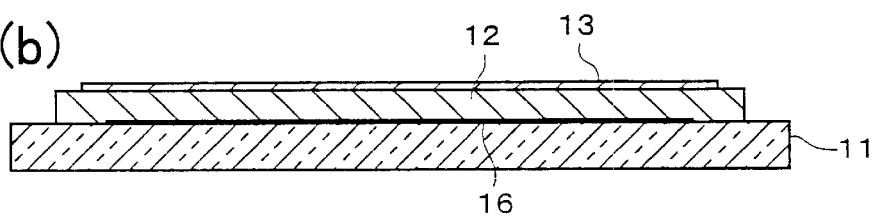
FIG. 6(b) is a longitudinal sectional view schematically illustrating the electromagnetic wave detecting device.
Figure 7:
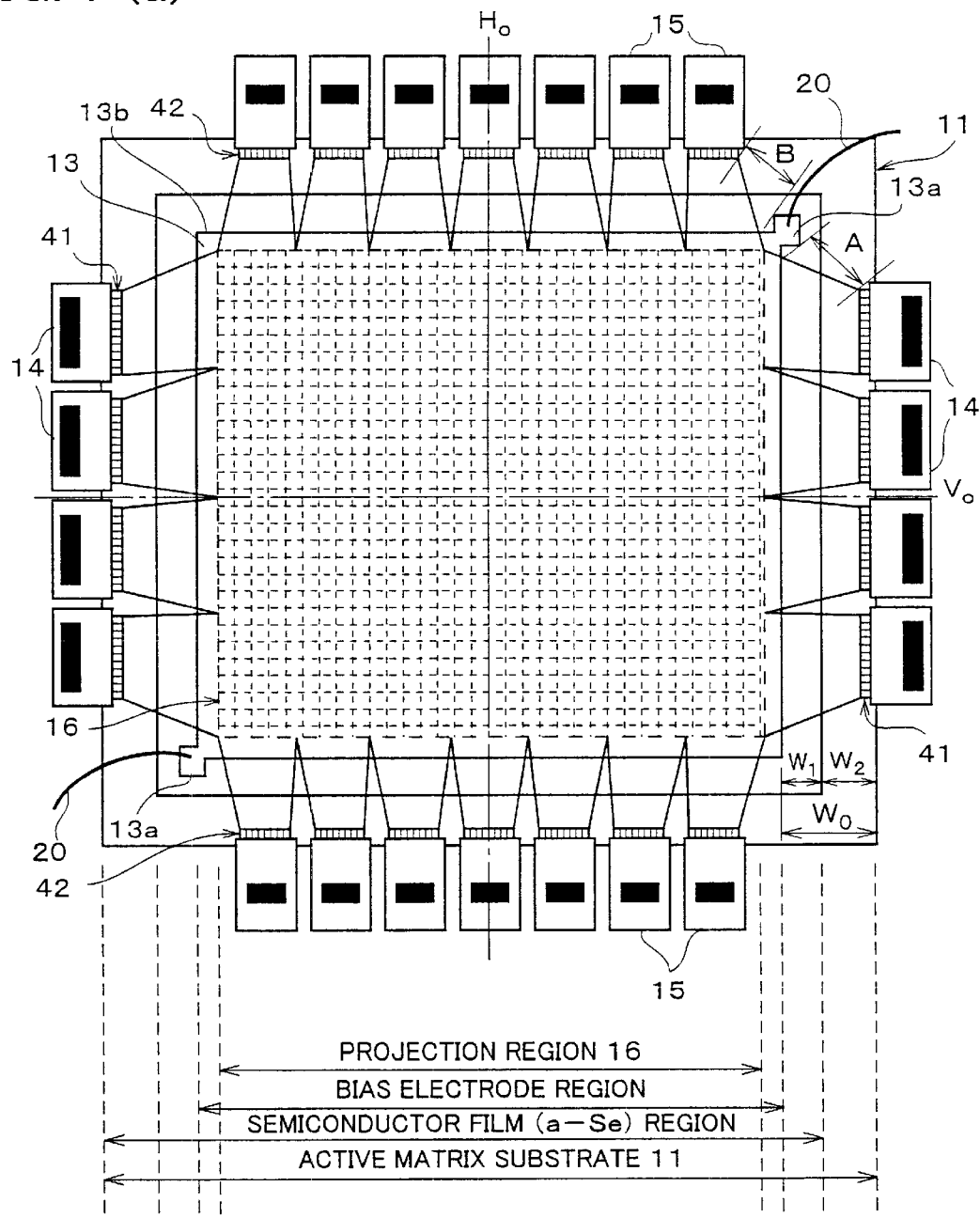
FIG. 7(a) is a plan view illustrating an arrangement of an electromagnetic wave detecting device according to still a further embodiment of the present invention.
FIG. 7(b) is a longitudinal sectional view schematically illustrating the electromagnetic wave detecting device.
Figure 7:
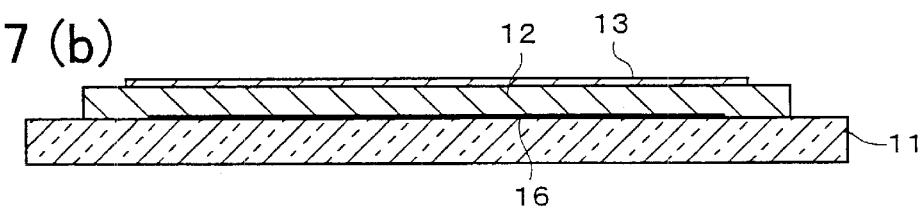

The structure of keeping the distance A and the distance B 1.5 cm or more can be used for the structure shown in FIG. 6 and FIG. 7, which differs from the structure shown in FIG. 1 and FIG. 5.

In the electromagnetic wave detecting device shown in FIG. 6(a), adjacent gate drivers 14 and adjacent readout amplifiers 15 are provided in a short pitch, and the gate drivers 14 and the readout amplifiers 15 are provided in a gathering manner respectively around the center Vo in the vertical direction and the center Ho in the horizontal direction.

Further, in the electromagnetic wave detecting device shown in FIG. 7, the gate drivers 14 and the readout amplifiers 15 are arranged so as to be provided equally (e.g., symmetrically) on both sides of the center Vo in the vertical direction and the center Ho in the horizontal direction, respectively. The distance Wo from the external edge of the bias electrode 13 to the external edge of the active matrix substrate 11 is longer than that of the electromagnetic wave detecting device shown in FIG. 1 and FIG. 10, that is, the flaming region of the active matrix substrate 11 is wider. Thus, in the electromagnetic wave detecting device shown in FIG. 7, a distance W1 from the external edge of the bias electrode 13 to the external edge of the semiconductor region and a distance W2 from the external edge of the semiconductor region to the external edge of the active matrix substrate 11 are established so as to be wide.

With the structure as described above, it is ensured to make use of the nature of the electromagnetic wave detecting device that the detection sensitivity of the electromagnetic wave becomes high in response to the application of a high voltage to the bias electrode 13, thereby obtaining the high sensitive electromagnetic wave detecting device.

Further, as described before, it is preferable that the bias electrode 13, the bias supply line 20, and the connecting section 13a are well molded for insulation. In addition, it is possible to further ensure to inhibit the occurrence of electrical discharge by molding for insulation so as to cover all mounted parts (for example, the parts where the signal input terminal 41 and the signal output terminal 42 are bonded to TAB terminals by anisotropic electrical conductive film) after mounting external circuits such as TAB (a gate driver 14, a readout amplifier 15, and other circuits).

An electromagnetic wave detecting device can be provided with an active matrix substrate having in its circumference signal input terminals and signal output terminals, a semiconductor film, provided on the active matrix substrate, having electromagnetic wave conductivity, and a bias electrode, having a connecting section to which a bias supply power source is connected, for applying a bias voltage to the semiconductor film, wherein a distance between the connecting section and at least one of the signal input terminal and the signal output terminal is set to be 1.5 cm or more.

According to this structure, in case of using an amorphous Se film (a-Se film) as the semiconductor film, the a-Se film is capable of deposition directly on the active matrix substrate at a low temperature and in a large area, for example, by the vacuum evaporation method. In the electromagnetic wave detecting device using the semiconductor film which is made up of such an a-Se film, a high voltage of nearly 5000V-15000V as a bias voltage can be applied to absorb an electric charge efficiently.

In this case, if the distance between the connecting section of the bias electrode and at least one of the signal input terminal and the signal output terminal is established to be 1.5 cm or more, it is possible to ensurely prevent the electric discharge between at least one of the signal input terminal and the signal output terminal even in case of applying a high voltage of 15000V to the connecting section. This makes it possible to ensurely make use of the nature of the electromagnetic wave detecting device that the detection sensitivity of the electromagnetic wave becomes high in response to the application of a high voltage to the bias electrode, thereby obtaining the high sensitive electromagnetic wave detecting device.

Further, in the electromagnetic wave detecting device, the active matrix substrate can be substantially rectangular, and the connecting section of the bias electrode can be provided in a vicinity of a corner of the active matrix substrate.

Furthermore, in the electromagnetic wave detecting device, the active matrix substrate can be substantially rectangular, and the connecting section of the bias electrode can be provided in a vicinity of at least one of two corners which are diagonal to each other in the active matrix substrate.

Both of the above structures make it easy to form the connecting section of the bias electrode outside of the projection region which is made up of pixel alignment region, thereby being easier to arrange at least one of the signal input terminal and the signal output terminal so as to be on the side which is away from the connecting section.

Further, another electromagnetic wave detecting device can be provided with an active matrix substrate having a projection region which is made up of a pixel alignment region where a plurality of signal input terminals and signal output terminals are provided in a circumference of the projection region, a semiconductor film, provided on the active matrix substrate, having electromagnetic wave conductivity, a bias electrode, having a connecting section to which a bias supply power source is connected, for applying a bias voltage to the semiconductor film, wherein at least one of the signal input terminal and the signal output terminal are provided offset so as to be on a side which is away from the connecting section of the bias electrode with respect to the center position of the projection region.

This structure makes it possible to prevent a unnecessary electric discharge such as atmospheric discharge and surface creepage between at least one of the signal input terminal and the signal output terminal and the connecting section of the bias electrode. As a result, it is possible to prevent the damage to the electromagnetic wave detecting device by the electric discharge and to increase reliability of the electromagnetic wave detecting device.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. An electromagnetic wave detecting device comprising:

an active matrix substrate including in its circumference signal input terminals and signal output terminals, a semiconductor film, provided on said active matrix substrate, having electromagnetic wave conductivity, and a bias electrode, having a connecting section to which a bias supply power source is connected, for applying a bias voltage to said semiconductor film, wherein at least one of the signal input terminals and the signal output terminals are provided offset so as to be on a side which is away from the connecting section of said bias electrode.

2. The electromagnetic wave detecting device according to claim 1, wherein said active matrix substrate is substantially rectangular, and the connecting section of said bias electrode is provided in a vicinity of a corner of said active matrix substrate.

3. The electromagnetic wave detecting device according to claim 2, wherein said active matrix substrate is substantially rectangular, and the connecting section of said bias electrode is provided in a vicinity of at least one of two corners which are diagonal to each other in said active matrix substrate.

4. The electromagnetic wave detecting device according to claim 1, wherein an electrical charge is generated when an incident x-ray is detected.

5. The electromagnetic wave detecting device according to claim 1, wherein the connecting section to which the bias supply power source is connected is covered with a molded resin.

6. The electromagnetic wave detecting device according to claim 1, wherein the bias supply power source supplies the connecting section with a voltage of not more than 15000V.

7. The electromagnetic wave detecting device according to claim 1, wherein parts where external circuits are mounted with respect to the signal input terminals and the signal output terminals and the connecting section of said bias electrode are covered with a molded resin, respectively.

8. An electromagnetic wave detecting device comprising:

an active matrix substrate including in its circumference signal input terminals and signal output terminals, a semiconductor film, provided on said active matrix substrate, having electromagnetic wave conductivity, and a bias electrode, having a connecting section to which a bias supply power source is connected, for applying a bias voltage to said semiconductor film, wherein a distance between the connecting section and at least one of the signal input terminal and the signal output terminal is set to be 1.5 cm or more.

9. The electromagnetic wave detecting device according to claim 8, wherein said active matrix substrate is substantially rectangular, and the connecting section of said bias electrode is provided in a vicinity of a corner of said active matrix substrate.

10. The electromagnetic wave detecting device according to claim 9, wherein said active matrix substrate is substantially rectangular, and the connecting section of said bias electrode is provided in a vicinity of at least one of two corners which are diagonal to each other in said active matrix substrate.

11. The electromagnetic wave detecting device according to claim 8, wherein parts where external circuits are mounted with respect to the signal input terminals and the signal output terminals and the connecting section of said bias electrode are covered with a molded resin, respectively.

12. An electromagnetic wave detecting device comprising:

an active matrix substrate including a projection region which is made up of a pixel alignment region where a plurality of signal input terminals and signal output terminals are provided in a circumference of the projection region, a semiconductor film, provided on said active matrix substrate, having electromagnetic wave conductivity, a bias electrode, having a connecting section to which a bias supply power source is connected, for applying a bias voltage to said semiconductor film, wherein at least one of the signal input terminals and the signal output terminals are provided offset so as to be on a side which is away from the connecting section of said bias electrode with respect to the center position of the projection region.

* * * * *